United States Patent
Kim

(10) Patent No.: US 7,919,228 B2
(45) Date of Patent: Apr. 5, 2011

(54) METHOD OF FORMING PATTERN OF SEMICONDUCTOR DEVICE

(75) Inventor: Dae Woo Kim, Yongin-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 648 days.

(21) Appl. No.: 11/962,483

(22) Filed: Dec. 21, 2007

(65) Prior Publication Data

US 2008/0227034 A1  Sep. 18, 2008

(30) Foreign Application Priority Data

Mar. 15, 2007 (KR) .................. 10-2007-0025522

(51) Int. Cl.
*G03F 7/26* (2006.01)
(52) U.S. Cl. .......................... 430/313; 430/330
(58) Field of Classification Search .................. 430/311, 430/322, 313, 330
See application file for complete search history.

(56) References Cited

U.S. PATENT DOCUMENTS

| 6,365,325 | B1 | 4/2002 | Chiang et al. ................. 430/313 |
| 2008/0206914 | A1* | 8/2008 | Haase et al. .................... 438/34 |

FOREIGN PATENT DOCUMENTS

KR  10-2001-0080842  8/2001

* cited by examiner

*Primary Examiner* — Kathleen Duda
(74) *Attorney, Agent, or Firm* — Marshall, Gerstein & Borun LLP

(57) ABSTRACT

The present invention relates to a method of forming a pattern of a semiconductor device. According to the method, patterns are formed on a substrate. First photoresist patterns are formed in regions where the patterns are opened. The first photoresist patterns are diffused to upper corners of the patterns, thus forming second photoresist patterns. The patterns are etched using the second photoresist patterns as an etch-stop layer. Accordingly, smaller photomask patterns can be formed.

10 Claims, 2 Drawing Sheets

METHOD OF FORMING PATTERN OF SEMICONDUCTOR DEVICE

CROSS-REFERENCES TO RELATED APPLICATIONS

The priority of Korean patent application number 10-2007-25522, filed on Mar. 15, 2007, is hereby claimed and the disclosure thereof is incorporated herein by reference in its entirety.

BACKGROUND OF THE INVENTION

The present invention relates to a method of forming a pattern of a semiconductor device and, more particularly, to a pattern formation method of a semiconductor device for forming micro photomask patterns.

A type of semiconductor device includes a plurality of memory cell elements therein. As semiconductor devices become highly integrated, elements must be formed on a predetermined cell area of the device with a high density. Due to this requirement, the size of a unit memory cell element gradually decreases. As high integration of semiconductor technology rapidly proceeds, it has become important to form a micro pattern when implementing the pattern using photolithography. When implementing a pattern using photolithography, a line width that can be implemented may be restricted by one or more factors including but not limited to thickness, sensitivity, Post Exposure Bake (PEB), development, etch processes, etc. of a photoresist film.

BRIEF SUMMARY OF THE INVENTION

The present invention enables a finer micro photomask pattern process by forming a photoresist pattern between photomask patterns using a self-aligned method employing a negative type photoresist, performing an annealing process for enlarging the photoresist pattern, and performing an etch process on the photomask pattern using the photoresist pattern as an etch-stop layer.

A method of forming a pattern of a semiconductor device according to an embodiment of the present invention includes forming patterns on a substrate, forming first photoresist patterns in regions where the patterns are opened, diffusing the first photoresist patterns to upper corners of the patterns, thus forming second photoresist patterns, and etching the patterns using the second photoresist patterns as an etch-stop layer.

Annealing may be performed on the first photoresist patterns to diffuse the first photoresist patterns. The first photoresist pattern may have a size whose change depending on temperature is constant upon annealing. The first photoresist patterns preferably are formed using a negative type photoresist. The patterns preferably are formed from an opaque material. The patterns preferably are formed from chrome (Cr). The patterns preferably are formed using a phase inverse layer. The substrate preferably is formed from a transparent material. The substrate preferably is formed from $SiO_2$. The formation of the first photoresist patterns may include forming a photoresist film on the patterns formed on the substrate, performing an exposure process on the photoresist film from the other side of the substrate, and performing a development process on the photoresist film, thus forming the first photoresist patterns in the regions where the patterns are opened. The first photoresist patterns preferably are further formed on the upper corners of the patterns. Sidewalls of the first photoresist patterns preferably are formed vertically.

DESCRIPTION OF SPECIFIC EMBODIMENTS

Now, a specific embodiment according to the present invention will be described with reference to the accompanying drawings.

However, the present invention is not limited to the disclosed embodiment, but may be implemented in various manners. The embodiment is provided to complete the disclosure of the present invention and to allow those having ordinary skill in the art to understand the present invention. The present invention is defined by the claims.

FIGS. 1A to 1E are sectional views illustrating a method of forming a pattern of a semiconductor device according to an embodiment of the present invention.

Figure 1A:
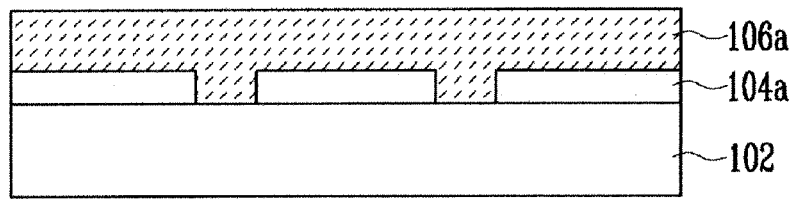
FIGS. 1A to 1E and FIG. 2 are sectional views illustrating a method of forming a pattern of a semiconductor device according to an embodiment of the present invention.

Referring to FIG. 1A, first patterns 104a are formed on one side of a photomask substrate 102. The photomask substrate 102 may be formed from a material (for example, $SiO_2$, etc.) through which an exposure light source used in a photolithography process can transmit. The first patterns 104a may be formed from a material (for example, chrome (Cr), etc.) through which an exposure light source used in a photolithography process cannot transmit. Furthermore, the first pattern 104a is patterned more minutely in a subsequent process and therefore may have a size greater than that of a pattern that will finally be formed.

A photoresist film 106a is formed over the entire surface, including the photomask substrate 102 and the first patterns 104a. The photoresist film 106a may be formed thicker than the first patterns 104a in such a way to fully cover the first patterns 104a. The photoresist film 106a may be formed from a negative type photoresist whose portions in which an optical reaction occurs through exposure are cross-linked, resulting patterns formed therein, and portions in which an optical reaction does not occur due to shielding are dissolved and removed through a development process. Further, the photoresist film 106a may be formed using a Chemical Amplified Resist (CAR) with a high contrast so that micro patterns can be formed. The photoresist film 106a may be formed from a material whose size variation depending on temperature upon annealing is constant and size variation upon annealing is high. To this end, the photoresist film 106a is formed from a material that is able to maintain a Photo Acid Generator (PAG) concentration to a specific concentration. The annealing is performed such that temperature distributions of the entire photoresist film 106a can become constant.

Meanwhile, the thickness of the photoresist film 106a may be adequately set by considering the size variation of the photoresist pattern and the role as an etch-stop layer through a subsequent annealing process. In other words, if the thickness of the photoresist film 106a is thick and therefore the height of the photoresist pattern formed in a subsequent patterning process is increased, the size variation of the photoresist pattern is increased in an annealing process of the photoresist pattern. Accordingly, the size of the photoresist pattern 106a to cover the first patterns 104a may further increase.

Figure 1B:
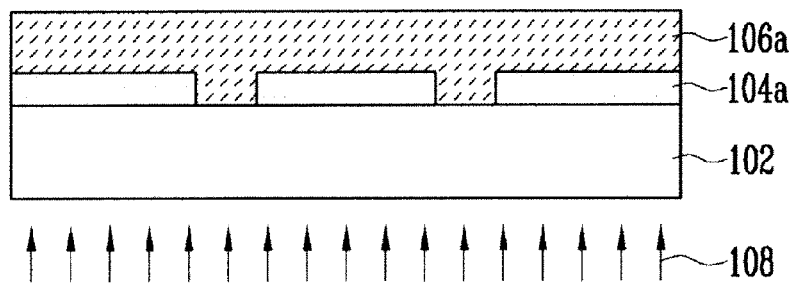

Referring to FIG. 1B, an exposure process employing a light source 108 is performed on the photoresist film 106a from the other side of the photomask substrate 102 where the photoresist film 106a is not formed. Through this exposure process, the light source 108 that has passed through the transparent photomask substrate 102 reaches portions of the photoresist film 106a, which are formed in regions where the first patterns 104a are opened, so that an optical reaction occurs in the portions, which are then cross-linked. In contrast, the photoresist film 106a formed on the first patterns 104a is not exposed to the light source since the first patterns 104a shield the light source.

The light source 108 used in the exposure process may employ ultraviolet rays (UV). The UV is not limited to UV having a specific wavelength. A UV source or laser light having a single wavelength or a short wavelength may be used as the light source 108.

Figure 1C:
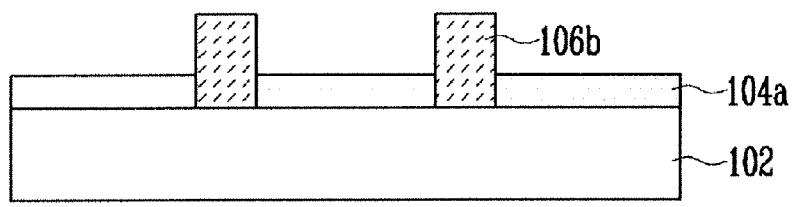
Figure 2:
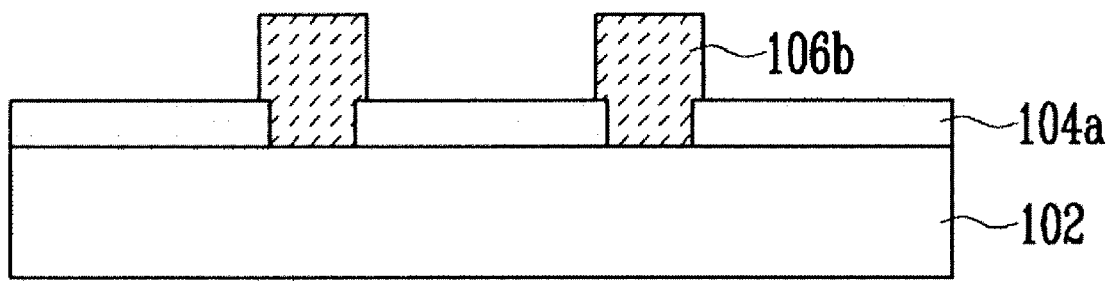

Referring to FIG. 1C, a development process is performed on the photoresist film (refer to 106a of FIG. 1B) on which the exposure process has been performed. Through the development process, the portions of the photoresist film 106a formed on the first patterns 104a, in which the optical reaction was not generated in the exposure process, are removed, but portions of the photoresist film 106a, which are formed in the region where the first patterns 104a are opened, remain, thus forming photoresist patterns 106b. Accordingly, the photoresist patterns 106b are formed in a self-aligned manner in the regions where the first patterns 104a are opened. As shown in the FIG. 2, the photoresist patterns 106b may also be formed in some of upper corners of the regions where the first patterns 104a are formed. Furthermore, the photoresist patterns 106b are formed thicker than the first patterns 104a.

In order for the photoresist patterns 106b, formed by the development process, to collapse due to a high aspect ratio, a surfactant may be used during the development process. Furthermore, in order for the photoresist pattern 106b to horizontally extend onto the first patterns 104a to a certain extent through a subsequent annealing process, an angle of the sidewall of the photoresist pattern 106b may be almost vertical. If the sidewall angle of the photoresist pattern 106b is much smaller than vertical, the degree of the photoresist pattern 106b which is extended horizontally on the first patterns 104a may be too small.

Figure 1D:
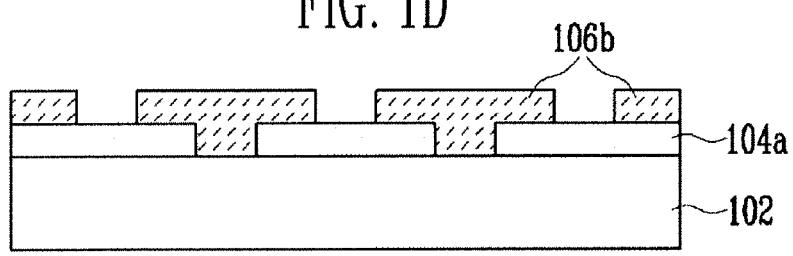

Referring to FIG. 1D, an annealing process is performed on the photoresist patterns 106b. Thus, the lateral size of the photoresist patterns 106b that are formed higher than the first patterns 104a is increased, so that they cover part of the top surfaces, in particular, corners of the first patterns 104a. In this embodiment, a change of the size of the photoresist patterns 106b is constant depending on temperature upon annealing. Accordingly, since the photoresist patterns 106b are constantly changed depending on temperature upon annealing, the degree to which each photoresist pattern 106b is extended horizontally on the first patterns 104a can be controlled. The photoresist patterns 106b are used as etch-stop layers in a subsequent etch process of the first patterns 104a. It is therefore possible to form a pattern having a desired size by changing temperature conditions in an annealing process.

The annealing process may be performed using a baker (not shown) capable of constantly controlling a temperature applied to the photoresist patterns 106b on a region or time basis by taking the thermal conductivity of the photomask substrate 102 into consideration.

Figure 1E:
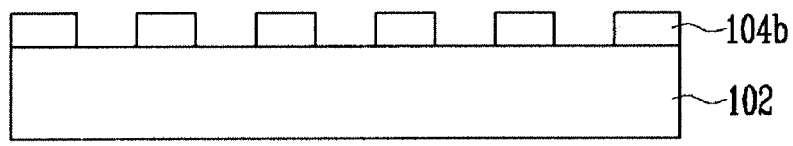

Referring to FIG. 1E, an etch process is performed on the exposed first patterns (refer to 104a of FIG. 1D) using the photoresist patterns (refer to 106b of FIG. 1D) as an etch-stop layer. Thus, the second patterns 104b that are smaller than the first patterns 104a are formed. The photoresist patterns 106b are then removed. Accordingly, fabrication of the photomask pattern according to an embodiment of the present invention is completed. The photomask according to an embodiment of the present invention can be applied to form a kind of binary mask having a light-shield film and a transmission film and a phase shift mask having a phase inverse layer.

Meanwhile, in order to improve process margin and resolutions, the photomask patterns may be formed using an Optical Proximity Correction (OPC) method. However, if the OPC method is used, forming the mask patterns on the photomasks may become complicated and difficult. In particular, resolutions of optical equipment used to form the patterns of the photomasks are limited due to the application of a Sub-Resolution Assist Feature (SRAF). In particular, in case of patterns of a small size in which the linearity of the Critical Dimension (CD) is incomplete, there may be a case where the small patterns may not be formed due to a change of a micro process, uniformity of the CD, and so on. Thus, some improvements of resolutions may be expected depending on a change of process conditions, but it is difficult to accomplish significant effects and find an optimal process due to an increase of various parameters.

Further, in the event that micro patterns are formed using a double exposure method, it is difficult to control alignment accuracy of first and second exposed patterns. Incompleteness of a process may be increased due to the use of a conductive photoresist film used to prevent a charging effect. In addition, a process must be checked in order to determine whether defects occur, and the turn around time (TAT) and expenses necessary for mask fabrication are increased due to an increased exposure time for double exposure in optical equipment.

In accordance with the method of forming a pattern of a semiconductor device according to an embodiment of the present invention, photoresist patterns are formed between photomask patterns using a self-aligned method employing a negative type photoresist. An annealing process for spreading the photoresist patterns horizontally is performed. An etch process is then performed on the photomask pattern using the photoresist patterns as an etch-stop layer. Accordingly, smaller photomask patterns can be formed. Furthermore, limit resolutions of optical equipment can be overcome, misalignment of patterns can be prevented, and the TAT can be shortened.

What is claimed is:

1. A method of forming a pattern of a semiconductor device, the method comprising:
    forming first patterns on a substrate wherein the first patterns are separated from each other;
    forming a photoresist pattern that is thicker than the first patterns between the first patterns;
    performing an annealing process to increase a lateral size of the photoresist pattern and to cover a portion of each of the first patterns, thereby forming a recess on each of the first patterns; and
    etching portions of the first patterns exposed by the recess, thereby forming second patterns that are smaller than the first patterns.

2. The method of claim 1, wherein the photoresist pattern has the lateral size whose change depending on temperature is constant upon annealing.

3. The method of claim 1, comprising forming the photoresist patterns pattern using a negative type photoresist.

4. The method of claim 1, comprising forming the first patterns from an opaque material.

5. The method of claim 1, comprising forming the first patterns from chromium (Cr).

6. The method of claim 1, comprising forming the first patterns of a phase inverse layer.

7. The method of claim 1, comprising forming the substrate from a transparent material.

8. The method of claim 1, comprising forming the substrate from $SiO_2$.

9. The method of claim 1, comprising forming the photoresist pattern by a method comprising:

forming a photoresist film on the first patterns formed on the substrate;

performing an exposure process on the photoresist film from the side of the substrate opposite the photoresist film; and performing a development process on the photoresist film, thus forming the photoresist pattern between the first patterns.

10. The method of claim 1, comprising forming sidewalls of the photoresist pattern vertically.

* * * * *